United States Patent [19]

Ikuta

[11] Patent Number: 4,866,471

[45] Date of Patent: Sep. 12, 1989

[54] BATTERY CHECK DEVICE FOR CAMERA

[75] Inventor: Kiyoshi Ikuta, Kanagawa, Japan

[73] Assignee: Canon Kabushiki Kaisha, Tokyo, Japan

[21] Appl. No.: 313,282

[22] Filed: Feb. 17, 1989

Related U.S. Application Data

[63] Continuation of Ser. No. 027,608, Mar. 18, 1987, abandoned.

[30] Foreign Application Priority Data

Mar. 25, 1986 [JP] Japan ................................ 61-066979
Mar. 25, 1986 [JP] Japan ................................ 61-066980

[51] Int. Cl.⁴ ...................... G03B 17/18; G08B 21/00; G01N 27/46
[52] U.S. Cl. .................................. 354/468; 340/636; 324/431
[58] Field of Search ................ 354/468, 127.1, 127.12; 340/636, 660, 661, 663; 324/431, 433; 320/48

[56] References Cited

U.S. PATENT DOCUMENTS

| | | | |
|---|---|---|---|
| 3,781,658 | 12/1973 | Godshalk | 324/431 |
| 3,991,553 | 11/1976 | Bergey et al. | 340/636 X |
| 4,027,231 | 5/1977 | Lohrmann | 340/636 X |
| 4,377,787 | 3/1983 | Kikuoka et al. | 324/431 |
| 4,525,055 | 6/1985 | Yokoo | 354/468 |
| 4,595,880 | 6/1986 | Patil | 324/431 |

FOREIGN PATENT DOCUMENTS

| | | | |
|---|---|---|---|
| 46332 | 3/1983 | Japan | 354/468 |
| 56177 | 3/1984 | Japan | 324/426 |
| 230640 | 11/1985 | Japan | 354/468 |
| 66974 | 4/1986 | Japan | 340/636 |

Primary Examiner—W. B. Perkey
Attorney, Agent, or Firm—Robin, Blecker, Daley & Driscoll

[57] ABSTRACT

A battery check device for a camera which is capable of accurately making a battery check without being affected by temperature comprises detecting means for detecting the service condition of a battery; comparison means for comparing the detection value obtained by the service condition detecting means with a reference value; informing means for informing the photographer of the service capacity of the battery in response to the output of the comparison means; and changing means for changing the reference value to change thereby the informing state of the informing means according to temperature.

60 Claims, 8 Drawing Sheets

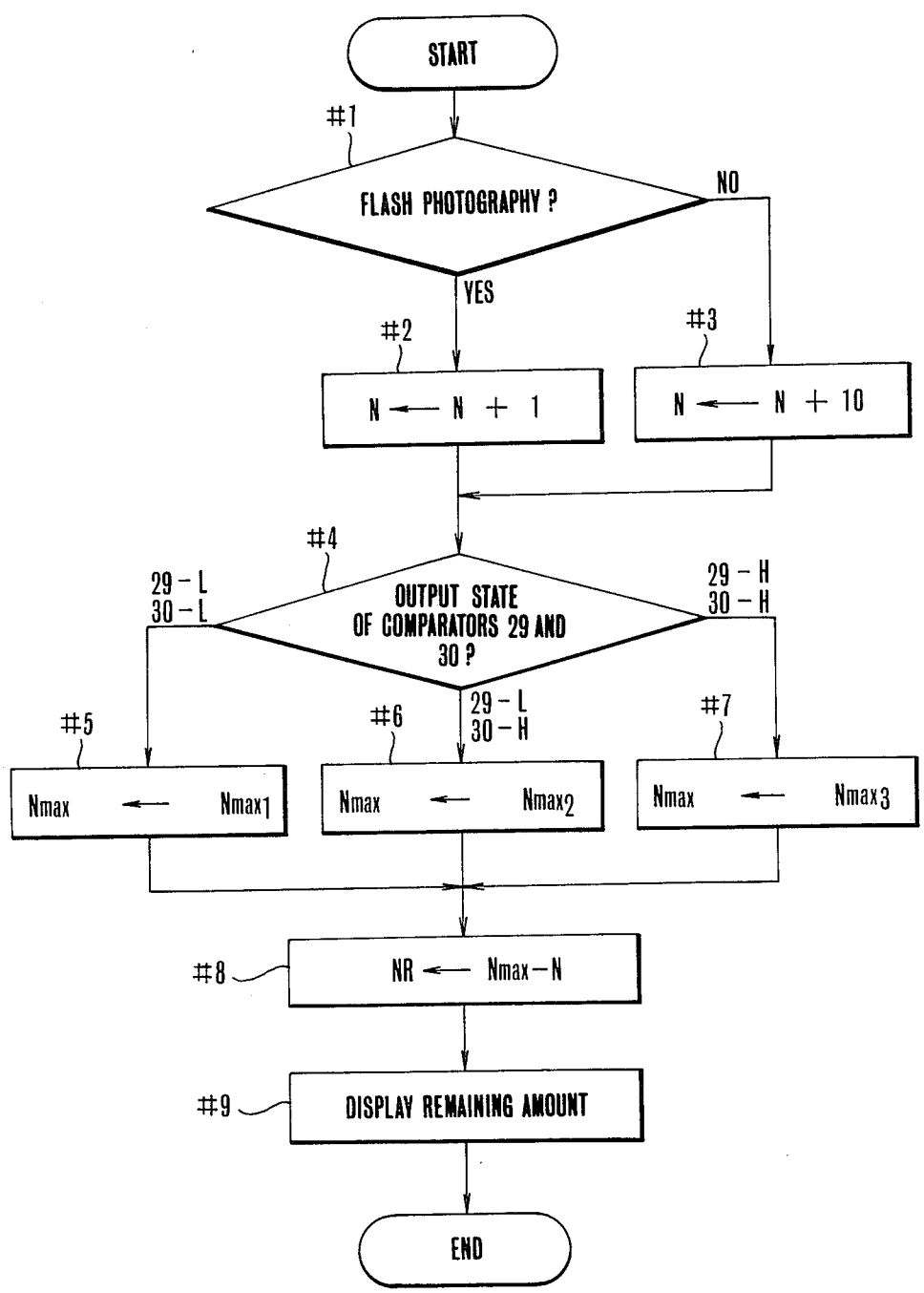

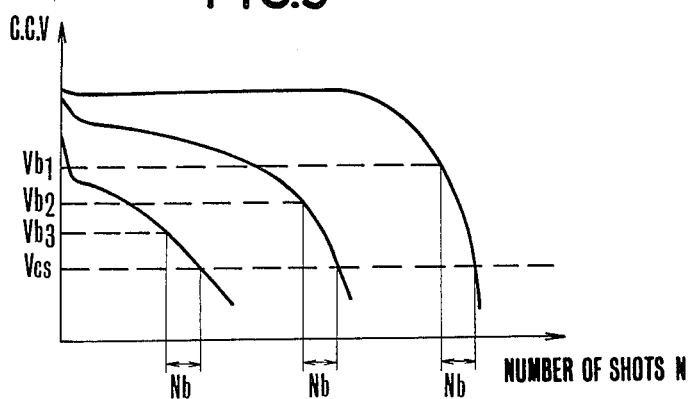
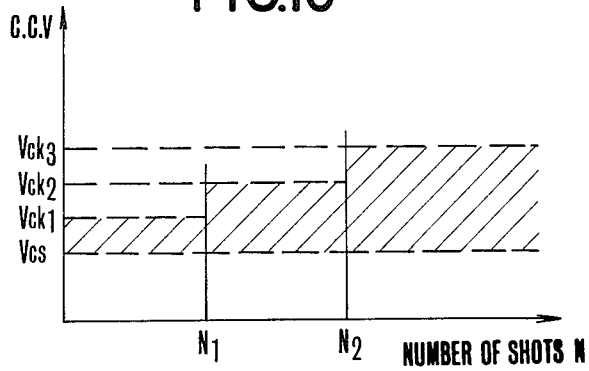

BATTERY CHECK DEVICE FOR CAMERA

This application is a continuation of application Ser. No. 027,608, filed Mar. 18, 1987, now abandoned.

BACKGROUND OF THE INVENTION

1. Field of the Invention

This invention relates to a battery check device and more particularly to a battery check device for a camera which is capable of accurately performing a battery check without being affected by temperature.

2. Description of the Related Art

Generally the characteristic of a battery varies with temperature. This has prevented an accurate battery check and presented various inconveniences. For example, a relation between a voltage C.C.V which obtains between terminals when a given load current flows to a lithium battery generally used as a power source for a camera and the number N of shots (weighted differently for flash photography from ordinary photography) each corresponding to a photographing operation is as shown in FIG. 11 of the accompanying drawings with temperature used as a parameter. In FIG. 11, an inhibition level Vcs indicates that the camera is unable to normally operate below this level. As shown, the characteristic of the battery changes in general with variations in temperature According to the results of tests, a maximum photographable number of shots Nmax(L) under a low temperature condition, say, $-20°$ C. greatly differs from a maximum photographable number of shots Nmax(H) under a temperature condition.

Accordingly to the method conventionally employed, a battery check is made as follows: The maximum photographable number of shots Nmax is first obtained from the maximum capacity of the battery. This value is used as an initial value. A number of times which is weighted (for example, differently between the flash photography and ordinary photography) at every shot is subtracted from the initial value. The remainder of the battery capacity is displayed on the basis of the remainder of the shot number. The conventional battery check device of this kind has been arranged to adjust the maximum photographable number of shots Nmax to the maximum shot number Nmax(L) which is guaranteed by the camera using the battery for photographing at the lowest service temperature. Therefore, in the case that photographing is continuously performed at room temperature, further photographing might still be possible to a considerable extent in actuality even when the display indicates nearly zero remainder. Conversely, if the max. shot number Nmax is adjusted to the maximum shot number Nmax(H) photographable at room temperature, continuous photographing at low temperature might result in a failure even when the display indicates a relatively large remaining amount of the battery capacity.

As obvious from FIG. 11, the number of photographable shots (the max. number of shots Nmax) decreases according as the temperature lowers. However, at a point near the inhibition level Vcs, the voltage dropping rate becomes moderate in comparison with the number of shots. Meanwhile, at a relatively high temperature (at room temperature or higher), there is a point at which the terminal voltage C.C.V of the battery becomes almost unvarying irrespectively of the number of shots. Thus, at the relatively high temperature, the number of photographable shots increases. In that event, however, the inclination of the curve comes to increase in the neighborhood of the inhibition level Vcs. Therefore, in addition to the inhibition level, Vcs, if a warning level Vck is set for warning against the impending arrival of the inhibition level Vcs as shown in FIG. 12, the number of shots Nb (Nb1, Nb2, Nb3) photographable after the warning level Vck and before the inhibition level Vcs varies with temperature. Then, the number of shots Nb that can be made after the warning is produced with the battery capacity dropping below the warning level Vck, fluctuates due to temperature.

Further, when the camera is brought into a low temperature condition when the terminal voltage C.C.V. of the battery has lowered to a level close to the warning level Vck after continuous photographing at room temperature or above it, the camera might cease to operate. In other words, the camera suddenly becomes inoperative due to the exhaustion of the battery energy without giving any prior warning. Such an accident results from a change in the battery capacity caused by temperature. For example, when the battery is in a state of having its capacity exhausted 80%, the terminal voltage C.C.V thereof is variable to a greater extent by a change of temperature. Meanwhile, an attempt to solve this problem by setting the above stated warning level Vck at a high level would result in a premature warning under a lower temperature condition and thus would excessively limit the serviceability of the camera.

SUMMARY OF THE INVENTION

It is therefore an object of this invention to provide a battery check device which is capable of accurately making a battery check without being affected by temperature and comprises: detecting means for detecting the service condition of a battery; comparison means for comparing a detection value obtained by the service condition detecting means with a reference value; informing means for informing the photographer of the service capacity of the battery in response to the output of the comparison means; and changing means for changing the reference value to change the informing state of the informing means according to temperature.

The above and further object and features of this invention will become apparent from the following detailed description of embodiments thereof taken in conjunction with the accompanying drawings.

BRIEF DESCRIPTION OF THE DRAWINGS

FIG. 7 is a flow chart showing the operation of the same.

FIG. 9 is a graph showing the number of photographable shots in relation to the terminal voltage of a battery.

FIG. 10 is a graph showing the number of shots in relation to a warning level.

DETAILED DESCRIPTION OF THE PREFERRED EMBODIMENTS

Figure 1:
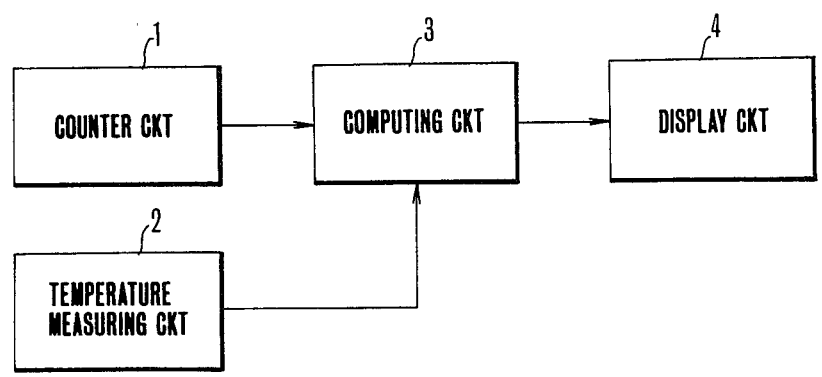
FIG. 1 is a block diagram showing an embodiment of this invention.

FIG. 1 shows in a block diagram an embodiment of this invention A counter circuit 1 is used as detecting means for detecting the service condition of a battery by counting the number of shots performed for photographing. A temperature measuring circuit 2 is arranged to measure the temperature of the battery during a photographing operation. A computing circuit 3 is used as comparison means for computing the remaining amount of energy of the battery by the number of shots, a maximum photographable shots and the temperature. A display circuit 4 is used as an informing means for displaying the remaining amount of energy computed by the computing circuit 3.

Briefly stated, the embodiment which is arranged as mentioned above operates as follows: The counter circuit 1 counts the number of times for which the photographing operation of the camera is performed. A count number (the number of shots) is supplied to the computing circuit 3. Further, at that time, the count number which is obtainable from the counter circuit 1 is arranged to vary for flash photography from ordinary photography. More specifically, the difference in the count number is determined by the ratio of the amount of current consumed for flash photography to that of the current consumed for ordinary photography. The temperature measuring circuit 2 measures temperature. Temperature information thus obtained is supplied to the computing circuit 3. Assuming that the count number of the counter circuit 1 is N, the temperature measured at that time is Ti and the maximum photographable number of shots at a temperature of −20° C. is Nmax(L), the remaining amount of capacity Nr of the battery is expressed:

$$Nr = M(Ti) \times Nmax(L) - N \qquad (1)$$

Figure 2:
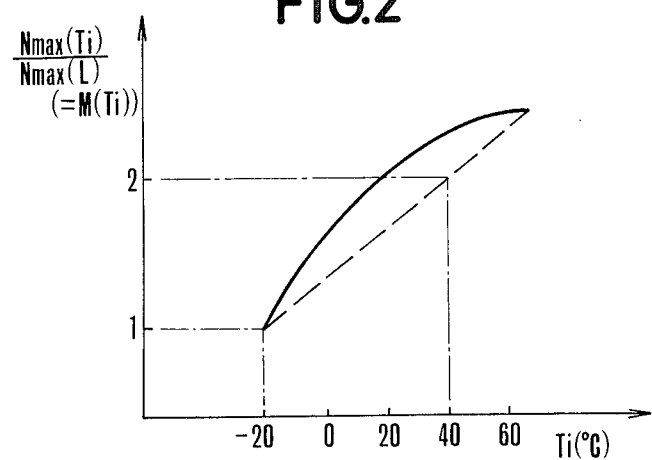
FIG. 2 is a graph showing a maximum number of photographable shots with the same embodiment in relation to temperature.

In Formula (1) above, M(Ti) represents a variable for correcting the maximum photographable number of shots Nmax according to the temperature and is a function of the temperature Ti. In other words, the maximum photographable number of shots Nmax varies with temperature. Therefore, a maximum photographable number of shots Nmax(Ti) at an arbitrary temperature Ti is obtainable by adjusting the variable M. The relation of the max. photographable or possible) number of shots Nmax to temperature Ti is as shown in FIG. 2. In FIG. 2, the axis of ordinate shows the relative value of Nmax(Ti), with the max. possible number of shots Nmax(L) at temperature Ti=−20° C. assumed to be "1". Assuming that a straight broken line of FIG. 2 is the variable M(Ti) and the temperature Ti is varying from −20° C. to 60° C., the variable M(Ti) can be expressed as shown below:

$$M(Ti) = 1/60 \, (Ti + 20) + 1 \qquad (2)$$

The computing circuit 3 obtains the variable M(Ti) from Formula (2) above on the basis of temperature information from the temperature measuring circuit 2.

Following that, the circuit 3 begins to compute the remaining amount Nr of the battery from Formula (1) above on the basis of the number of shots N obtained from the counter circuit 1. The result of this is displayed by the display circuit 4. While the variable M(Ti) is arranged in the embodiment to be obtained within the computing circuit 3, the arrangement may be changed to obtain it within the temperature measuring circuit 2.

Figure 3:
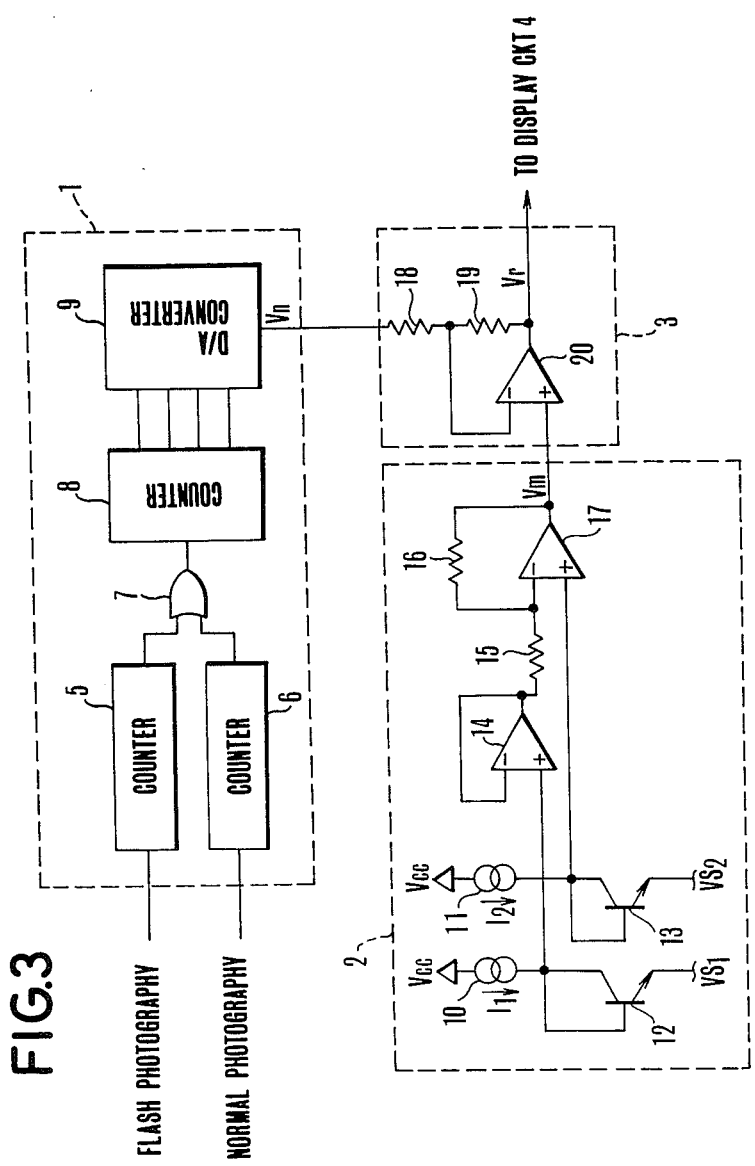
FIG. 3 is a circuit diagram showing the details of FIG. 1.

FIG. 3 is a circuit diagram showing by way of example the details of the block diagram of FIG. 1. The counter circuit 1 comprises a counter 5 connected to a circuit which is not shown but is arranged to generate one pulse for every performance of flash photography; a counter 6 connected to a circuit which is not shown but is arranged to generate one pulse for every performance of ordinary photography; an OR gate 7; a counter 8 which is arranged to count a number of pulses coming from the OR gate 7 to give a number of shots N; and a D/A converter 9 which is arranged to convert into an analog signal the number of shots N coming from the counter 8 in the form of a digital signal. The temperature measuring circuit 2 comprises constant current sources 10 and 11 arranged to generate constant currents I1 and I2 when power supply Vcc is switched on; transistors 12 and 13 each of which has its base and collector short-circuited and its emitter connected to a reference voltage source Vs1 or Vs2; a buffer 14; resistors 15 and 16; and a differential amplifier 17. The computing circuit 3 comprises resistors 18 and 19; and a differential amplifier 20.

The circuit arranged as described above operates as follows: When a photographing operation is performed once, one pulse is generated by a circuit which is not shown. If the photographing operation is performed in flash photography, the counter 5 up counts by one. If it is performed in ordinary photography, the other counter 6 up counts by one. Assuming that the current consumption of the ordinary photography and that of the flash photography are in the ratio of 1:10, the counters 5 and 6 are arranged to operate in decimal notation and in centensimal notation respectively. Namely, the counter 6 generates one pulse when the ordinary photography is performed 100 times. The counter 5 generates one pulse when the flash photography is performed 10 times. This arrangement is intended to make the degree of consumption of the battery for one shot (N=1) unvarying irrespectively of the photographing mode. The pulse signal which is thus generated by the counter 5 or 6 is supplied to the counter 8 via the OR gate 7. The count number of the counter 8 then increases by one. These counters 5, 6 and 8 are all reset when the battery is replaced with a new battery. The count number (or the number of shots N) is converted into an analog signal in the form of a voltage Vn by the D/A converter 9. Therefore, the voltage Vn becomes a value corresponding to the number of shots N counted by the counter 8, that is, a weighted number of times for which the photographing operation is performed.

Meanwhile, the temperature Ti is detected by utilizing the temperature characteristic of the base-emitter voltages of the transistors 12 and 13. Assuming that the constant currents generated by the constant current sources 10 and 11 are I1 and I2 and the resistance values of the resistors 15 and 16 are R1 and R2 respectively, the output voltage Vm of the differential amplifier 17 can be expressed as follows:

$$Vm = \frac{R2}{R1} \cdot \frac{kT}{q} \ln \frac{I2}{I1} + \frac{R2}{R1}(Vs2 - Vs1) \quad (3)$$

wherein k represents a Boltzmann's constant; q the amount of electric charge of electrons; and T absolute temperature. The right-hand side of Formula (3) above can be rearranged as follows:

$$A = \frac{R2}{R1} \cdot \frac{k}{q} \ln \frac{I2}{I1} \quad (4)$$

$$B = \frac{R2}{R1}(Vs2 - Vs1) \quad (5)$$

Then, if the ratio of the resistance value R1 to R2 and the ratio of the constant current value I1 to I2 are unvarying against temperature variations with each of the values Vs1 and Vs2 temperature-compensated, the above stated values A and B can be considered constants for the temperature Ti. Formula (3) then can be expressed as:

$$Vm = ATi + B \quad (6)$$

The output voltage Vm thus becomes a value proportional to the temperature Ti. Accordingly, with the reference voltages Vs1 and Vs2, the resistance values R1 and R2 and the constant current values I1 and I2 set at suitable values, the output voltage Vm of the differential amplifier 17 becomes a value corresponding to the first term "M(Ti)×Nmax(L)" of the right-hand side of Formula (1). Therefore, assuming that the resistance values of the resistors 18 and 19 are R3 and R4, the output voltage Vr of the differential amplifier 20 becomes:

$$Vr = R3/R4(Vm - Vn) \quad (7)$$

Then, if the resistance values of the resistors 18 and 19 are arranged to be R3=R4, Formula (7) corresponds to Formula (1). Therefore, the output voltage Vr of the differential amplifier 20 becomes a value corresponding to the remaining amount Nr of the battery capacity at temperature Ti. With this information supplied to the display circuit 4 which is arranged in a known manner, the remaining amount of the battery can be accurately displayed.

Figure 5:
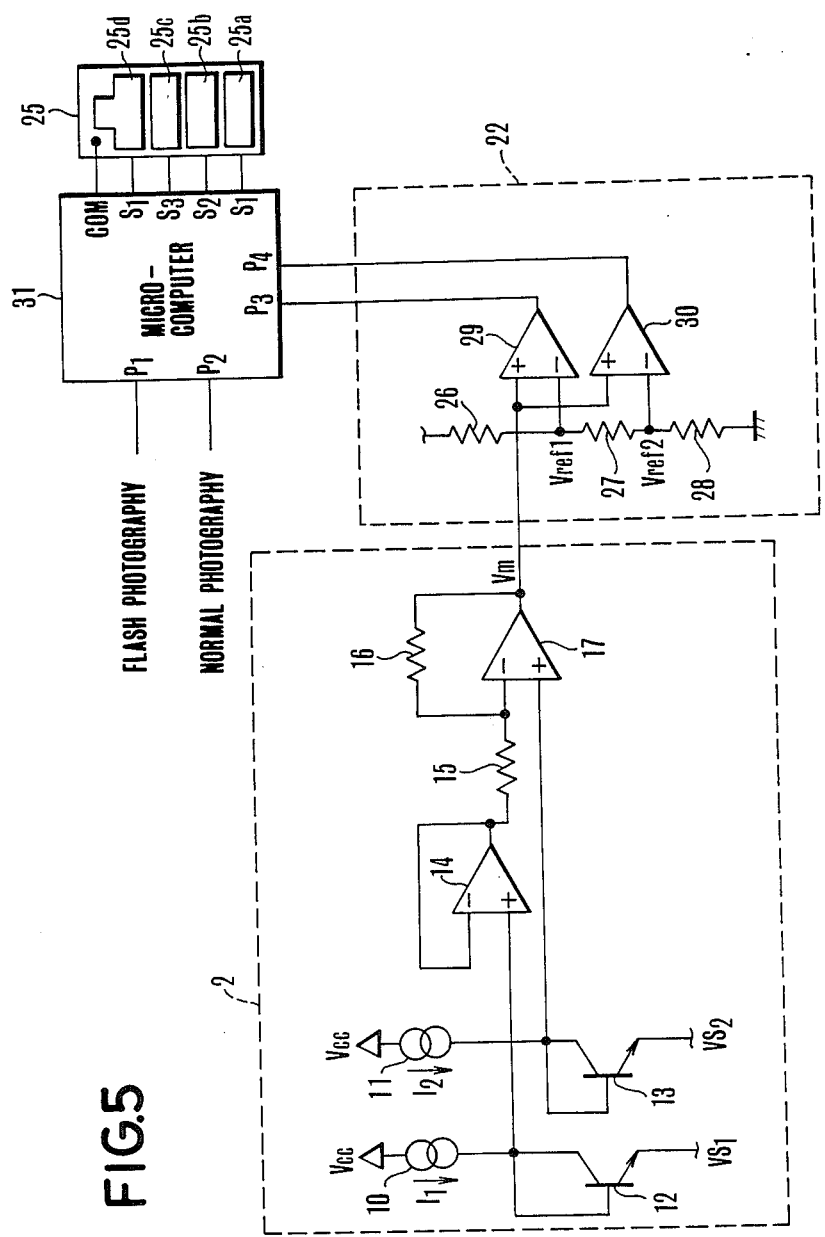
FIG. 5 is a circuit diagram showing the details of FIG. 4.
Figure 6:
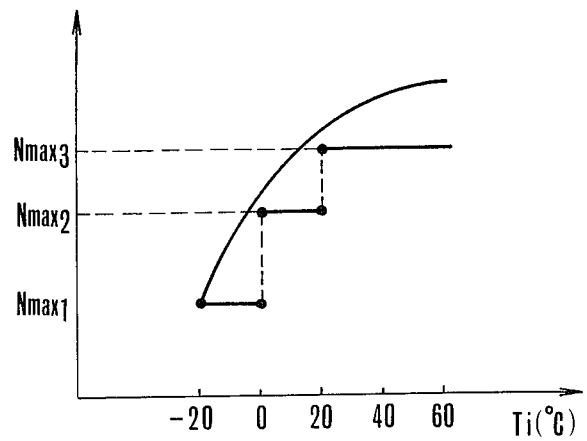
FIG. 6 is a graph showing a maximum number of photographable shots with the same embodiment in relation to temperature.

In the embodiment shown in FIGS. 1 to 3, the maximum photographable number of shots Nmax is arranged to be analytically changed according to temperature. In other words, the variable M(Ti) is obtained according to Formula (2). This method permits accurately obtaining the maximum photographable number of shots Nmax. However, the circuit arrangement which is necessary for carrying out Formula (2) is complex. Therefore, to make the circuit arrangement simpler, another embodiment is arranged to change the maximum photographable number of shots Nmax in a digital manner as shown in FIGS. 4 to 6.

In this case, the temperature Ti is divided into some number of ranges. The maximum photographable number Nmax of shots is arranged to be unvarying within each of these ranges. For example, under different temperature conditions $Ti < 0°$ C., $0°$ C. $\leq Ti < 20°$ C. and $20°$ C. $\leq Ti$, the max. photographable number of shots Nmax is assumed to be Nmax1, Nmax2 and Nmax3. Then, the remaining amount Nr of the battery capacity can be computed in a manner as shown below:

$Nr = Nmax1 - N$ for $Ti < 0°$ C.
$Nr = Nmax2 - N$ for $0°$ C. $\leq Ti < 20°$ C.
$Nr = Nmax3 - N$ for $20°$ C. $\leq Ti$ In this instance, however, it is necessary to set the max. photographable numbers of shots Nmax1, Nmax2 and Nmax3 at values not exceeding the actual maximum photographable number of shots Nmax(Ti).

Figure 4:
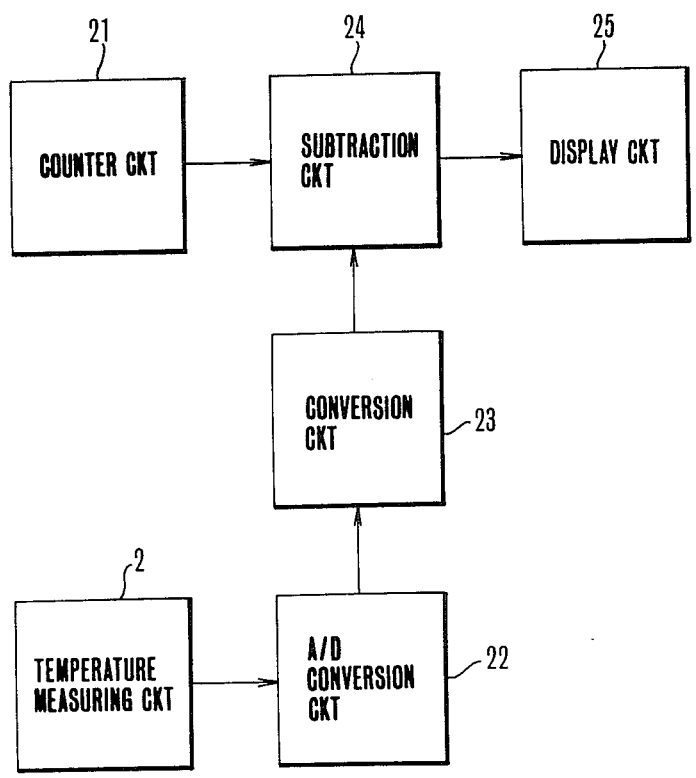
FIG. 4 is a block diagram showing another embodiment of this invention.

FIG. 4 shows in a block diagram the embodiment arranged to carry out the above stated digital method. The parts of FIG. 4 which are the same as those shown in FIG. 1 are indicated by the same reference numerals and the details of them are omitted from the following description: Referring to FIG. 4, a counter circuit 21 is arranged to count the number of shots N. An A/D (analog-to-digital) conversion circuit 22 is arranged to convert into a digital signal an analog signal (output voltage Vm) produced from a temperature measuring circuit 2 representing temperature information. A conversion circuit 23 is arranged to select the max. photographable number of shots Nmax1, Nmax2 or Nmax3 according to the digital temperature information received from the A/D conversion circuit 22 and to produce a signal corresponding to the result of selection. A subtraction circuit 24 is arranged to obtain the remaining amount Nr of the battery capacity from the number of shots N and the max. photographable number of shots Nmax. A display circuit 25 is arranged to display the remaining amount of the battery capacity.

A brief description of the operation of the above stated arrangement is as follows: In the same manner as in the example of embodiment first described in the foregoing, the counter circuit 21 counts the number of times for which the photographing operation of the camera is performed (the number of shots). The counted number is supplied to the subtraction circuit 24. Meanwhile, information on temperature measured by the temperature measuring circuit 2 is converted into a digital signal by the A/D conversion circuit 22. The digital signal is then converted by the conversion circuit 23 into a signal corresponding to the max. photographable number of shots Nmax within the applicable range of temperature. This signal is supplied to the above stated subtraction circuit 24. At the subtraction circuit 24, the number of shots N is subtracted from the max. possible number of shots Nmax to obtain the remaining amount Nr of the battery capacity. The result of this computing operation is then displayed by the display circuit 25.

FIG. 5 is a circuit diagram showing by way of example the details of the block diagram of FIG. 4. The A/D conversion circuit 22 comprises voltage dividing resistors 26, 27 and 28 which are provided for generating reference voltages Vref1 and Vref2; and comparators 29 and 30 which are arranged to compare the reference voltages Vref1 and Vref2 with the voltage Vm coming from the temperature measuring circuit 2. The counter circuit 21, the conversion circuit 23 and the subtraction circuit 24 are arranged to operate under the control of a microcomputer 31. The display circuit 25 is arranged to display the remaining amount of the battery in four steps by its display parts 25a to 25d.

The circuit arrangement described operates as shown by a flow chart in FIG. 7. Upon completion of one performance of the photographing operation, a circuit which is not shown generates one pulse. This pulse is supplied to an input port P1 of the micro-computer 31 in the event of flash photography or to another input port P2 in the case of ordinary photography. Then, the micro-computer 31 counts the number of shots N in a manner as shown at steps #1 to #3 (on a program) through the arrangement as stated in the description of the foregoing example of embodiment. Like in the foregoing embodiment, this embodiment is arranged to count the number of times for which the photographing operation is performed upon receipt of the pulse from the circuit (not shown) at every performance of flash photography or ordinary photography. However, if the micro-computer 31 is performing control over the whole camera operation, the micro-computer 31 is in a position to know the photographing operation from actions being performed within the micro-computer 31. In that event, it is possible to have the number of performances of the flash photography and the ordinary photography arranged to be countable on a program.

Meanwhile, like in the preceding example of embodiment, the temperature measuring circuit 2 produces a voltage Vm which is proportional to temperature Ti. The comparators 29 and 30 then perform their comparing operation on the voltage Vm. The resistance values of the voltage dividing resistors 26 to 28 are arranged to be such that the levels of the outputs of the comparators 29 and 30 both become low when the voltage Vm corresponds to $Ti < 0°$ C., the output level of only the comparator 30 becomes high when the voltage Vm corresponds to $0°$ C.$\leq Ti < 20°$ C. and the outputs of the comparators 29 and 30 both become high when the voltage Vm corresponds to $20°$ C.$\leq Ti$. In other words, the levels of the reference voltages Vref applied to the inverting input terminals of the comparators 29 and 30 are set at such values as to bring about the above stated output states of the comparators (Step #4).

In accordance with the states of the signal received from the A/D conversion circuit 22 at its input port P3 or P4, the micro-computer 31 selects the max. possible number of shots Nmax1, Nmax2 or Nmax3 according to the arrangement as shown in FIG. 6. More specifically, the max. possible number of shots Nmax1 is selected when both the output levels of the comparators 29 and 30 are low (Step #5); the max. possible number of shots Nmax2 is selected when the output level of the comparator 30 is alone high (Step #6); and the max. possible number of shots Nmax3 is selected when both the output levels of the comparators 29 and 30 are high (Step #7). Then, the counted number of shots N obtained at the count part is subtracted from the maximum possible number of shots Nmax (Step #8). As a result, a signal corresponding to the remaining amount Nr of the battery capacity is produced from output terminals S1 to S4. At a step #9, the remaining amount of the battery capacity is displayed by the display parts 25a to 25d of the display circuit 25. Briefly stated, the display is made as follows: The display parts 25a to 25d all light up when the capacity of the battery is little consumed. The display parts come to light up one after another in the order of the display parts 25a, 25b and 25c according as the degree of consumption increases. When the remaining amount of the battery capacity becomes lower than an inhibition level Vcs, the light of all the display parts 25a to 25d is extinguished.

In the embodiments shown in FIGS. 1 to 7, the max. possible number of shots at low temperature Nmax(L) ($-20°$ C. in the case of these embodiments) differs from the maximum possible number of shots at room temperature Nmax(H) to a relatively great degree and therefore, the max. possible number of shots is arranged to vary according to temperature. This arrangement ensures accurate display of the remaining amount of the battery capacity under varied temperature conditions.

Figure 8:
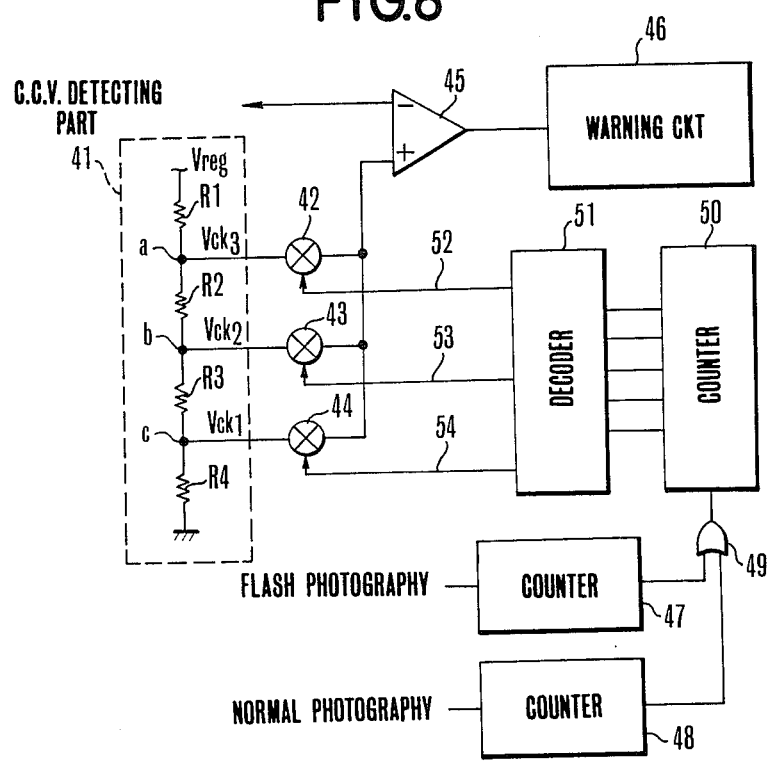
FIG. 8 is a block diagram showing a further embodiment of this invention.

FIGS. 8 to 10 show a further embodiment of this invention. The embodiment is first described in outline as follows: FIG. 9 shows voltages Vb1 to Vb3 representing different maximum photographable numbers of shots Nmax under different temperature conditions respectively preceding the inhibition level Vcs of the battery by a given number of shots Nb. As is evident from FIG. 9, the photographable number of shots Nb can be made unvarying after a warning against the impending occurrence of an unphotographable state of the battery by adjusting the warning level Vck according to temperature. In the case of this embodiment, the number of shots N is counted; the warning level Vck is then adjusted according to the current number of shots thus counted; and a warning is given accordingly to inform the photographer of the impending end of the serviceable life of the battery.

Figure 11:
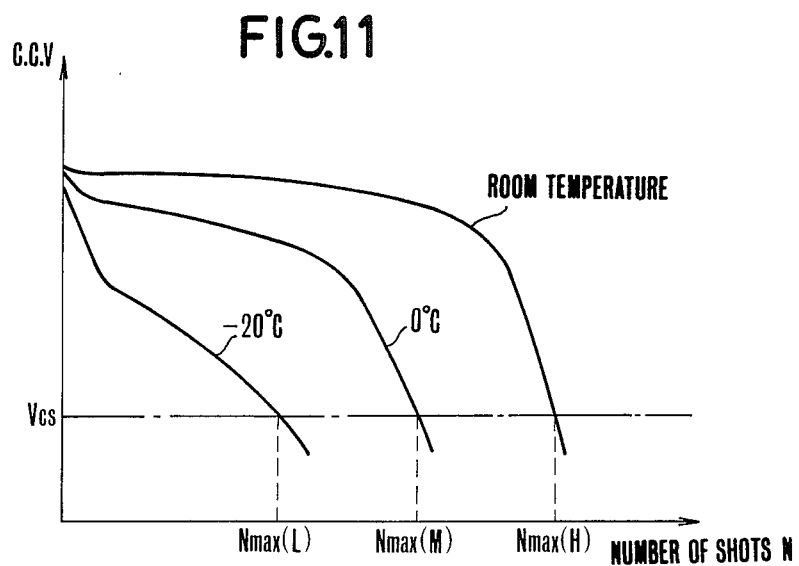
FIG. 11 is a graph showing the discharge characteristic of a lithium battery generally employed.
Figure 12:
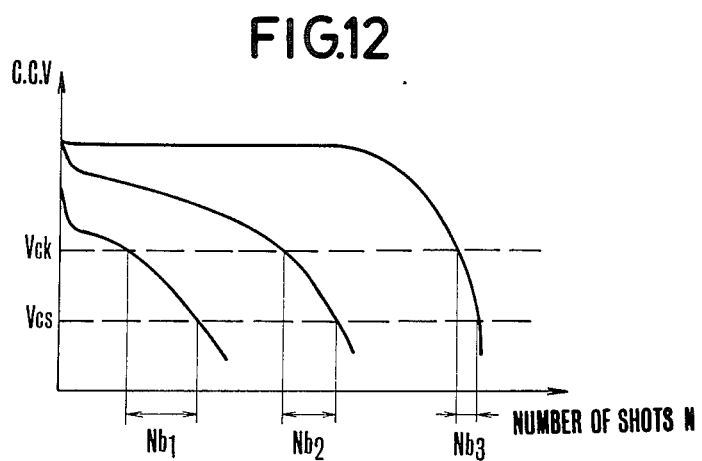
FIG. 12 is a graph showing a number of shots in relation to a warning level and an inhibition level.

FIG. 10 shows a relation between the number of shots N and the warning level Vck arranged by this embodiment. In this case, the warning level is divided into three steps Vck1 to Vck3. The relation is as follows:

Vck=Vck1 at the time of $N < N1$
Vck=Vck2 at the time of $N1 \leq N < N2$
Vck=Vck3 at the time of $N2 \leq N$ Therefore, the warning is produced when the voltage C.C.V between terminals of the battery drops to a level lower than the warning level Vck1, Vck2 or Vck3, that is, within the range indicated by hatched parts of FIG. 10. This is virtually the same as an arrangement to vary the warning level Vck according to a temperature condition obtained when a photographing operation is performed, because: In case that the terminal voltage C.C.V of the battery drops to a level for a relatively small number of shots, this may be considered to indicate that the camera is used under a low temperature condition. This is also obvious from FIG. 11. Conversely, when the camera is normally operating without any warning while the battery is considered to have been consumed to a great degree by many performances of the photographing operation as indicated by the number of shots, it may be considered to indicate that the camera is used under a relatively high temperature condition (or at room temperature or above it).

FIG. 8 is a circuit diagram showing a circuit arrangement useful in practicing this embodiment. A block 41 indicates a warning level generating circuit. In the circuit 41, the warning level Vck3 which is obtained by dividing a constant voltage Vreg is generated at a node "a" between voltage dividing resistors R1 and R2. The warning level Vck2 is generated at a node "b" between voltage dividing resistors R2 and R3. The warning level Vck1 is generated at a node "c" between voltage dividing resistors R3 and R4. Analog switches 42, 43 and 44 are arranged to turn on upon receipt of a high level signal from a decoder which will be described later. A comparator 45 serving as comparison means is arranged to compare the voltage C.C.V between terminals of the battery as obtained from a C.C.V detection part which serves as detecting means and is arranged to detect the serviceable state of the battery with the warning level Vck which comes through one of the analog switches 42, 43 and 44. A warning circuit 46 which serves as informing means for giving a warning against the impending end of the serviceable life of the battery in response to a high level signal from the comparator 45.

Counters 47 and 48 are connected to circuits not shown but arranged to generate one pulse every time flash photography or ordinary photography is performed once. The embodiment includes an OR gate 49; a counter 50 which is arranged to count the number of pulses coming through the OR gate 49, i.e. to count the number of shots; and a decoder 51 which serves as varying means and arranged to produce a high level signal through one of signal lines 52 to 54 in accordance with the content of the counter 50.

The operation of the embodiment is now described. A circuit which is not shown generates a single-pulse signal upon completion of one performance of photographing. If it is flash photographing, the counter 47 up counts by one. If it is ordinary photographing, the counter 48 up counts by one. Assuming that the current to be consumed by ordinary photography and the current to be consumed by flash photography are in the ratio of 1:10, the counter 48 generates one pulse when ordinary photographing is performed 100 times while the counter 47 generates one pulse when flash photographing is performed 10 times. In other words, the counters 47 and 48 are arranged to be decimal and centesimal counters respectively, because: The degree of consumption of the battery for one shot (N=1) must be arranged to be unvarying irrespectively of the photographing mode employed The pulse signal which is generated either by the counter 47 or by the counter 48 is supplied via the OR gate 49 to the counter 50. Then, the count number of the counter 50 increases by one. All of these counters 47, 48 and 50 are arranged to be reset when the battery is replaced with a new one.

The count number obtained at the counter 50 is supplied to the decoder 51 and is converted into a signal corresponding to the count number obtained at that time. More specifically, the decoder 51 supplies a high level signal via the signal line 54 to the analog switch 44 when the count number(the number of shots N) is at a value N<N1, supplies a high level signal via the signal line 52 to the anaolog switch 43 in the event of N1≦N<N2 or supplies a high level signal via the signal line 52 to the analog switch 42 in the event of N2≦N. Assuming that the count number obtained at the counter 50 is in a state of N<N1 and a high level signal is supplied via the signal line 54 to the analog switch 54 to turn on this switch, the warning level Vck1 which is generated at the node "c" is employed as the warning level in this case. This warning level Vck1 is suplied to the comparator 45 to be compared with the terminal voltage C.C.V of the battery supplied from the C.C.V detecting part to the comparator. If the terminal voltage C.C.V is found to be lower than the warning level Vck1, the comparator 45 produces a high level signal. This signal causes the warning circuit 46 to give a warning about the approaching end of the life of the battery. The decoder 51 likewise selects the warning level Vck2 in the event of N1≦N<N2 and another warning level Vck3 in the event of N2≦N. Then, when the terminal voltage C.C.V becomes lower than the warning level Vck2 or Vck3, the warning circuit 46 gives a warning about the approach of the end of the life of the battery. The embodiment thus realizes the relation between the number of shots N and the warning level Vck as shown in FIG. 10.

In this embodiment, the number of shots is weightedly counted according as the photographing operation is repeated. The level of the selected warning level Vck becomes higher according as the counted number of shots increases. This arrangement is virtually the same as the arrangement to change the warning level Vck according to temperature. The number of shots which are feasible after the warning is given and before the camera becomes inoperative remains unchanged by variations in temperature. The arrangement of this embodiment thus ensures the accuracy of the warning against the end of the life of the battery. Further, since the warning level Vck is arranged to become higher according as the number of shots N or the consumed degree of the battery increases, the warning level Vck3 can be applied to a number of possible shots prior to arrival of a consumed degree at which the camera becomes inoperative in the event of a low temperature condition. This arrangement, therefore, solves the problem that, after the terminal voltage C.C.V has dropped to a point close to the inhibiting level Vcs as a result of repeated photographing at room temperature or at a higher temperature, the camera would become completely inoperative if it is brought under a low temperature condition. In other words, with the warning level Vck set at a value higher than the terminal voltage C.C.V of the battery at which the camera would become completely inoperative under a low temperature condition, the camera is always operative under any serviceable temperature conditions as long as no warning is displayed on the camera.

In the case of this embodiment, the warning level Vck is arranged to be changed according to the number of shots. However, this arrangement of course may be changed to have the warning level Vck varied directly according to changes in temperature. In that instance, a circuit arrangement of such a temperature function as the one employed by the first embodiment is applicable to this embodiment. Further, in this specific embodiment, the warning level Vck is divided into three steps. However, it may be divided into two or four steps. The warning concerning the life of the battery can be more accurately given according as the number of the step divisions is increased. Although the increased number of divisions results in a complex decoder 51, in a camera in which a micro-computer is used, the method described in the foregoing can be accomplished within the micro-computer. The use of the micro-computer, therefore, permits reduction in size of the circuit arrangement.

Further, this invention is not only applicable to a battery check device for a lithium battery but also to a battery check device for batteries of different kinds.

The battery check device according to this invention, as described in the foregoing, comprises detecting means for detecting the service condition of a battery; comparison means for comparing a detection value obtained by the service condition detecting means with a reference value; informing means for informing the photographer of the serviceable capacity of the battery in response to the output of the comparison means; and changing means for changing the reference value to change the informing state of the informing means according to temperature. The battery check device is thus arranged to be capable of accurately making a battery check without being affected by temperature. The advantageous effect of this invention is, therefore, very high.

What is claimed is:

1. A battery check device for a camera, comprising:
(a) detecting means for detecting the service condition of a battery, said service condition detecting means including a counter means for counting the number of performances of the operation of said camera;
(b) comparison means for comparing the detection value obtained by the service condition detecting means with a reference value;
(c) informing means for informing the user of the service capacity of said battery in response to the output of said comparison means; and
(d) changing means for changing the reference value to change thereby the informing state of said informing means according to temperature.

2. A device according to claim 1, wherein said comparison means includes reference value setting means for setting as said reference value a value which corresponds to the life of said battery.

3. A device according to claim 1, wherein said comparison means includes a reference operable times setting means for setting as said reference value a predetermined number of times for which the operation of said camera is performable.

4. A battery check device for a camera, comprising:
(a) detecting means for detecting the service condition of a battery;
(b) comparison means for comparing the detecting value obtained by the service condition detecting means with a reference value, said comparison means including a reference value setting means for setting a value corresponding to a maximum performable number of times of the operation of said camera;
(c) informing means for informing the user of the service capacity of said battery in response to the output of said comparison means; and
(d) changing means for changing the reference value to change thereby the informing state of said informing means according to temperature.

5. A device according to claim 4, wherein said informing means includes a remaining capacity informing means for informing the user of the remaining amount of the capacity of said battery.

6. A device according to claim 5, wherein said remaining capacity informing means includes display means for displaying stepwise the consumed degree of the battery.

7. A device according to claim 4, wherein said informing means includes a display means.

8. A device according to claim 4, wherein said changing means includes means for setting said reference value at a lower value in response to a rise of temperature.

9. A device according to claim 4, wherein said changing means includes an analog changing circuit.

10. A device according to claim 4, wherein said changing means includes a digital changing circuit.

11. A device according to claim 4 wherein said service condition detecting means including voltage detecting means for detecting the voltage of said battery.

12. A device according to claim 4, wherein said comparison means includes reference value setting means for setting a value corresponding to a value at which a warning is to be given with regard to an approaching end of the life of said battery.

13. A device according to claim 4, wherein said comparison means includes reference voltage setting means for setting a predetermined voltage as said reference value.

14. A device according to claim 4, wherein said informing means includes warning means for giving a warning about an approaching end of the life of said battery.

15. A device according to claim 4, wherein said changing means includes means for setting said reference value at a higher value in response to an increase in the number of performances of the operation of said camera.

16. A battery check device for an apparatus comprising:
(a) detecting means for detecting the service condition of a battery, said service condition detecting means including a counter means for counting the number of performances of the operation of said apparatus;
(b) comparison means for comparing the detection value obtained by the service condition detecting means with a reference value;
(c) informing means for informing the user of the service capacity of said battery in response to the output of said comparison means; and
(d) changing means for changing the reference value to change thereby the informing state of said informing means according to temperature.

17. A device according to claim 16, wherein said comparison means includes reference value setting means for setting as said reference value a value which corresponds to the life of said battery.

18. A device according to claim 16, wherein said comparison means includes a reference operable times setting means for setting as said reference value a predetermined number of times for which the operation of said camera is performable.

19. A battery check device for an apparatus comprising:
(a) detecting means for detecting the service condition of a battery;
(b) comparison means for comparing the detection value obtained by the service condition detecting means with a reference value, said comparison means including a reference value setting means for setting a value corresponding to a maximum performable number of times of the operation of said apparatus;
(c) informing means for informing the user of the service capacity of said battery in response to the output of said comparison means; and
(d) changing means for changing the reference value to change thereby the informing state of said informing means according to temperature.

20. A device according to claim 19, wherein said informing means includes a remaining capacity informing means for informing the user of the remaining amount of the capacity of said battery.

21. A device according to claim 20, wherein said remaining capacity informing means includes display means for displaying stepwise the consumed degree of the battery.

22. A device according to claim 19, wherein said informing means includes a display means.

23. A device according to claim 19, wherein said changing means includes means for setting said reference value at a lower value in response to a rise of temperature.

24. A device according to claim 19, wherein said changing means includes an analog changing circuit.

25. A device according to claim 19, wherein said changing means includes a digital changing circuit.

26. A device according to claim 19 including voltage detecting means for detecting the voltage of said battery.

27. A device according to claim 19, wherein said comparison means includes reference value setting means for setting a value corresponding to a value at which a warning is to be given with regard to an approaching end of the life of said battery.

28. A device according to claim 19, wherein said comparison means includes reference voltage setting means for setting a predetermined voltage as said reference value.

29. A device according to claim 19, wherein said informing means includes warning means for giving a warning about an approaching end of the life of said battery.

30. A device according to claim 19, wherein said changing means includes means for setting said reference value at a higher value in response to an increase in the number of performances of the operation of said apparatus.

31. A battery check device for a camera, comprising:
(A) counting means for counting the number of performances of operation of said camera,
(B) indication means for indicating the service capacity of said battery in response to the output of said counting means, said indicating means being arranged to indicate the service capacity of the battery according to temperature as if said counting means output a different count value from its actual count value.

32. A device according to claim 31, wherein said indicating means includes means for displaying the service capacity of the battery.

33. A device according to claim 31, wherein said indicating means includes comparison means for comparing the output of the counting means with a reference value corresponding to the temperature.

34. A device according to claim 33, wherein said comparison means includes a reference value setting means for setting a value corresponding to a maximum performable number of times of the operation of said camera.

35. A device according to claim 33, wherein said comparison means includes a reference operable times setting means for setting as said reference value a predetermined number of times for which the operation of said camera is performable.

36. A device according to claim 33, wherein said indicating means includes changing means for changing a reference value in accordance with temperature.

37. A device according to claim 33, wherein said comparison means includes an analog comparison circuit.

38. A device according to claim 33, wherein said comparison means includes a digital comparison circuit.

39. A device according to claim 31, wherein said indicating means includes means for indicating the service capacity of the battery as if the counting means counts an increased count as the temperature lowers.

40. A battery check device for a camera, comprising:
(A) counting means for counting the number of performances of operation of said camera; and
(B) indicating means for indicating the service capacity of a battery, said indicating means changing a reference value for judging the service capacity of the battery according to the output of the counting means.

41. A device according to claim 40, wherein said indicating means includes means for setting said reference value at a higher value in response to an increase in the number of performances of operation of said camera.

42. A device according to claim 40, wherein said indicating means includes means for displaying the service capacity of the battery.

43. A device according to claim 40, wherein said indicating means includes comparison means for comparing the output of the battery with the reference value.

44. A device according to claim 42, wherein said display means includes means for warning that the service capacity of the battery is approaching a limit.

45. A device according to claim 44, wherein said indicating means includes means for maintaining the number of performances of operation of the camera always at an almost constant number during the period from when the display means produces the warning until when the service capacity of the battery actually reaches the limit.

46. A battery check device for an apparatus, comprising:
(A) counting means for counting the number of performances of operation of said apparatus,
(B) indication means for indicating the service capacity of said battery in response to the output of said counting means,
said indicating means being arranged to indicate the service capacity of the battery according to temperature as if said counting means output a different count value from its actual count value.

47. A device according to claim 46, wherein said indicating means includes means for displaying the service capacity of the battery.

48. A device according to claim 46, wherein said indicating means includes comparison means for comparing the output of the counting means with a reference value corresponding to the temperature.

49. A device according to claim 48, wherein said comparison means includes a reference value setting means for setting a value corresponding to a maximum performable number of times of the operation of said apparatus.

50. A device according to claim 48, wherein said comparison means includes a reference operarable times setting means for setting as said reference value a predetermined number of times for which the operation of said apparatus is performable.

51. A device according to claim 48, wherein said indicating means includes changing means for changing a reference value in accordance with temperature.

52. A device according to claim 48, wherein said comparison means includes an analog comparison circuit.

53. A device according to claim 48, wherein said comparison means includes a digital comparison circuit.

54. A device according to claim 46, wherein said means includes means for indicating the service of the battery as if the counting means counts an increased count as the temperature lowers.

55. A battery check device for an apparatus, comprising:
(A) counting means for counting the number of performances of operation of said apparatus; and (B) indicating means for indicating the service capacity of a battery, said indicating means changing a reference value for judging the service capacity of the battery accordingly to the output of the counting means.

56. A device according to claim 55, wherein said indicating means includes means for setting said reference value at a higher value in response to an increase in the number of performances of operation of said apparatus.

57. A device according to claim 55, wherein said indicating means includes means for displaying the service capacity of the battery.

58. A device according to claim 55, wherein said indicating means includes comparison means for comparing the output of the battery with the reference value.

59. A device according to claim 57, wherein said display means includes means for warning that the service capacity of the battery is approaching a limit.

60. A device according to claim 59, wherein said indicating means includes means for maintaining the number of performances of operation of the apparatus always at an almost constant number during the period from when the display means produces the warning until when the service capacity of the battery actually reaches the limit.

* * * * *